United States Patent [19]

Huang et al.

[11] Patent Number: 6,048,788
[45] Date of Patent: Apr. 11, 2000

[54] METHOD OF FABRICATING METAL PLUG

[75] Inventors: Hung-Yi Huang, Chang Hua Hsien; Wen-Yi Hsieh, Taipei; Chi-Rong Lin, Chang Hua Hsien; Jenn-Tarng Lin, Hsinchu, all of Taiwan

[73] Assignee: United Microelectronics Corp., Taiwan

[21] Appl. No.: 09/009,333

[22] Filed: Jan. 20, 1998

[30]  Foreign Application Priority Data

Nov. 24, 1997 [TW] Taiwan ................................. 86117571

[51] Int. Cl.$^7$ ..................... H01L 21/4763; H01L 21/44
[52] U.S. Cl. ........................ 438/629; 438/627; 438/628; 438/643; 438/644; 438/653; 438/654; 438/660; 438/672
[58] Field of Search ..................... 438/627, 628, 438/629, 643, 644, 653, 654, 660, 672

[56]  References Cited

U.S. PATENT DOCUMENTS 5,723,362  3/1998  Inoue et al. .............................. 437/190
5,874,355  2/1999  Huang et al. ............................ 438/627

*Primary Examiner*—John F. Niebling
*Assistant Examiner*—Alexander G. Ghyka
*Attorney, Agent, or Firm*—Rabin & Champagne PC

[57]  ABSTRACT

A method of forming a metal plug. A contact window is formed to penetrate through a dielectric layer on a substrate having a MOS formed thereon. A titanium glue layer is formed on the dielectric layer and the circumference of the contact window. A titanium barrier layer is formed on the titanium nitride layer. Using nitrogen plasma bombardment on the titanium nitride layer, the structure of the titanium nitride layer is transformed. The number of the nucleation seeds is increased, and the size of grains is reduced. A metal layer is formed on the titanium nitride layer and fills the contact window. A part of the metal layer is removed and a metal plug within the contact window is formed.

20 Claims, 5 Drawing Sheets

METHOD OF FABRICATING METAL PLUG

CROSS-REFERENCE TO RELATED APPLICATION

This application claims the priority benefit of Taiwan application serial no. 86117571, filed Nov. 24, 1997, the full disclosure of which is incorporated herein by reference.

BACKGROUND OF THE INVENTION

1. Field of the Invention

The invention relates to a method of fabricating multilevel interconnections of a semiconductor device, and more particularly to a method of fabricating a metal plug for multilevel interconnections.

2. Description of the Related Art

As the integration of semiconductors is enhanced, the dimensions of devices cannot supply enough area for interconnection. To match the requirements of the metal oxide semiconductor (MOS) devices with smaller dimensions, designs of multilevel interconnections are adapted in most of the integrated circuits (ICs). Normally, an inter-metal dielectric (IMD) layer is used to isolate two conductive layers. By the formation of a metal plug, the conductive layers are electrically connected. Moreover, to obtain a better dielectric characteristic, for example, the adhesion, a barrier layer made of a conductive material is formed between the metal plug and the conductive layer.

Titanium nitride is a very common material used as a barrier in a high density IC. To obtain a better ohmic contact between metal and silicon, a titanium nitride barrier layer is formed and assembled with a titanium layer as a titanium/titanium nitride layer. For example, for the process of fabricating a contact of an alloy, the whole metal structure is assemble by three different materials, titanium, titanium nitride, and alloys to decrease the work function, and the suppress the formation of spike and electromigration.

In a conventional process of forming a barrier and an interconnection structure, a titanium layer is formed. By physical vapour deposition, a titanium nitride layer having a thickness of about 800 Å to 1200 Å is formed on the titanium layer as a barrier layer. After a rapid thermal nitridation (RTN), a titanium nitride layer with a better contact with the titanium layer is formed. A refractory and conductive metal layer, such as a tunsteng layer, is formed. By performing an etching back process, a metal plug is formed. After cleaning the surface of the device, interconnection of another layer can be formed.

A conventional method is explained and shown on FIG. 1A to FIG. 1E.

Referring to FIG. 1A, on a substrate 100 having a MOS and metal layer formed thereon, a dielectric layer 102 is formed to isolate two metal layers. A better dielectric layer 102 is formed as a single-layered or double-layered spin-on-glass sandwich structured dielectric layer, which can prevent the voids formed during a pure chemical vapour deposition for forming a dielectric layer. Referring to FIG. 1B, using a mask to cover the dielectric layer 102, a photolithography process is performed to define a connecting channel for different metal layers. A contact window or a via hole is formed to expose the metal layer on the substrate 100. Referring to FIG. 1C, to enhance the adhesion between the tungsten plug formed subsequently and the other material, a titanium nitride layer or a tungsten nitride layer is formed before the formation of tungsten layer. Moreover, during the etching process, the titanium or tungsten nitride layer can be used as an etching stop layer due to the difference of plasma spectra between tungsten and titanium or tungsten nitride. Applying titanium nitride to the process metallization, titanium nitride is assembled with titanium as a form of titanium nitride/titanium layer. Before the formation of metal plug, a metal glue layer 106, such as a titanium layer, can be formed on the dielectric layer 102 and the circumference of contact window 104. By physical vapour deposition, a barrier layer 108 having a thickness of 800 Å to 1200 Å is formed on the metal glue layer 106. To improve the adhesion between the barrier layer 108 formed by titanium nitride and the metal layer 106, a rapid thermal nitridation is performed at a range of temperature between 550° C. to 900° C. Referring to FIG. 1D, a refractory and good conductive metal layer 110, for example, a tungsten layer, is formed on the barrier layer 108. The barrier layer 108 is covered by the metal layer 110, and the contact window 104 is filled by the metal layer 110. Referring to FIG. 1E, a part of the metal layer 110 is removed to form a metal plug 110a in the contact window 104. If the metal layer 110 is a tungsten layer, a gas source containing fluorine, such as a mixture of carbon fluoride and oxygen, a mixture of fluorine nitride and oxygen, or a mixture of fluorine sulfide and oxygen, is used as the etchant with the titanium nitride layer 106 as an etching stop layer. An etching back process is performed to form a tungsten plug 110a.

After the tungsten plug is formed, the subsequent processes, such as the deposition of another metal layer, photolithography and etching process, are performed to form the second level of interconnection.

In the above conventional process, the titanium nitride grain of the barrier layer is not uniform. Thus, during the deposition of tungsten, the reacting gas, tungsten fluoride ($WF_6$) is reacted with titanium glue layer along the edge of the titanium nitride grain of the barrier layer to form titanium tri-fluoride ($TiF_3$). An additional thermal process to remove the titanium tri-fluoride causes a volcano-like protrusion on the barrier layer. On the volcano-like protrusion, tungsten residue is left in the subsequent etching back process of tungsten.

In addition, the non-uniform titanium nitride grain further causes the deposited tungsten grain to be non-uniform. The larger size tungsten grain cannot be removed by the subsequent etching back process. The residue of tungsten is thus left.

SUMMARY OF THE INVENTION

It is therefore an object of the invention to provide a method of improving the structure of barrier structure. The titanium nitride grain is formed in an identical size. Consequently, the reaction of tungsten fluoride and the titanium glue layer along the edge of the titanium nitride grain of the barrier is suppressed. On the other hand, the tungsten is formed uniformly in an identical size. The tungsten residue is no longer left after the etching back process.

To achieve these objects and advantages, and in accordance with the purpose of the invention, as embodied and broadly described herein, the invention is directed towards a method of forming a metal plug. A contact window is formed to penetrate through a dielectric layer on a substrate having a MOS formed thereon. A titanium glue layer is formed on the dielectric layer and the circumference of the contact window. A titanium barrier layer is formed on the titanium nitride layer. Using nitrogen plasma bombardment on the titanium nitride layer, the structure of the titanium nitride layer is transformed. The number of the nucleation seeds is increased, and the size of grains is reduced. A metal layer is formed on the titanium nitride layer and fills the contact window. A part of the metal layer is removed and a metal plug within the contact window is formed.

It is to be understood that both the foregoing general description and the following detailed description are exemplary and explanatory only and are not restrictive of the invention, as claimed.

DESCRIPTION OF THE PREFERRED EMBODIMENTS

Figure 1A:
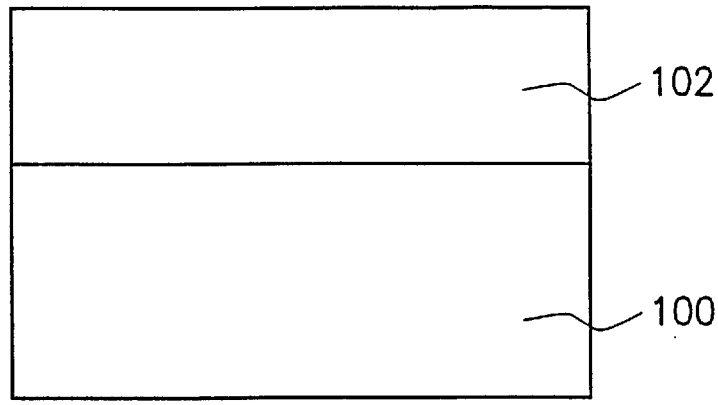
FIG. 1A to FIG. 1E are cross sectional views of a conventional process of forming an interconnection of a semiconductor device.
Figure 1B:
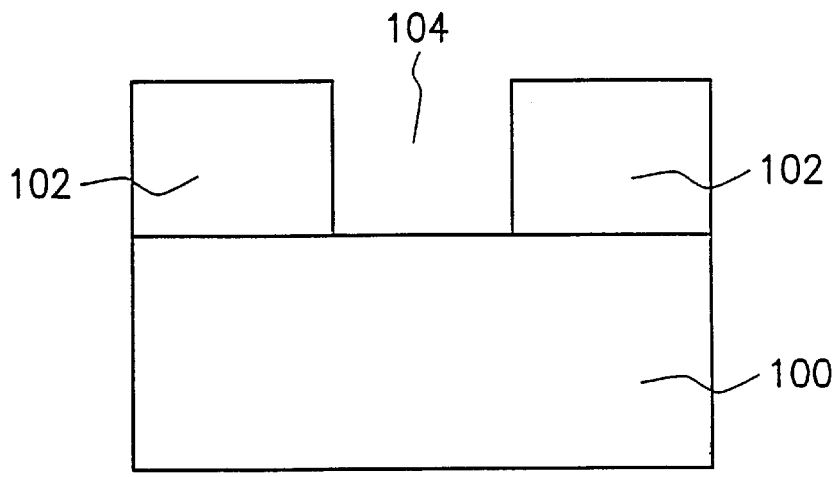
Figure 1C:
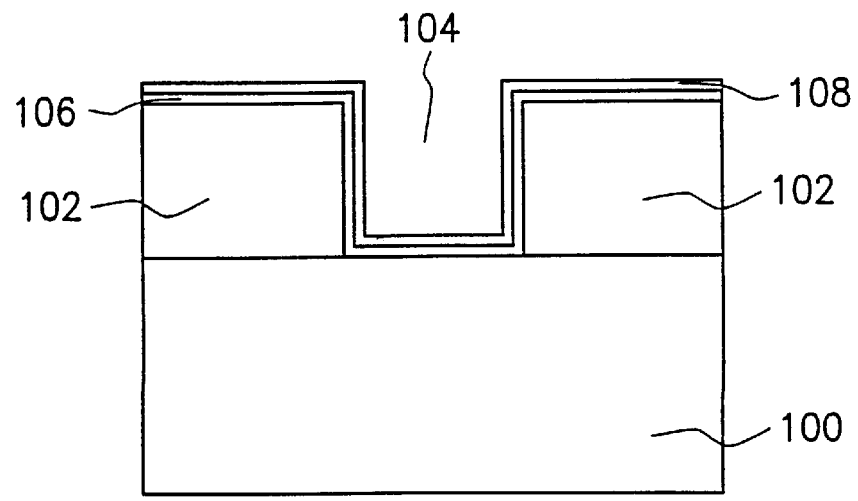
Figure 1D:
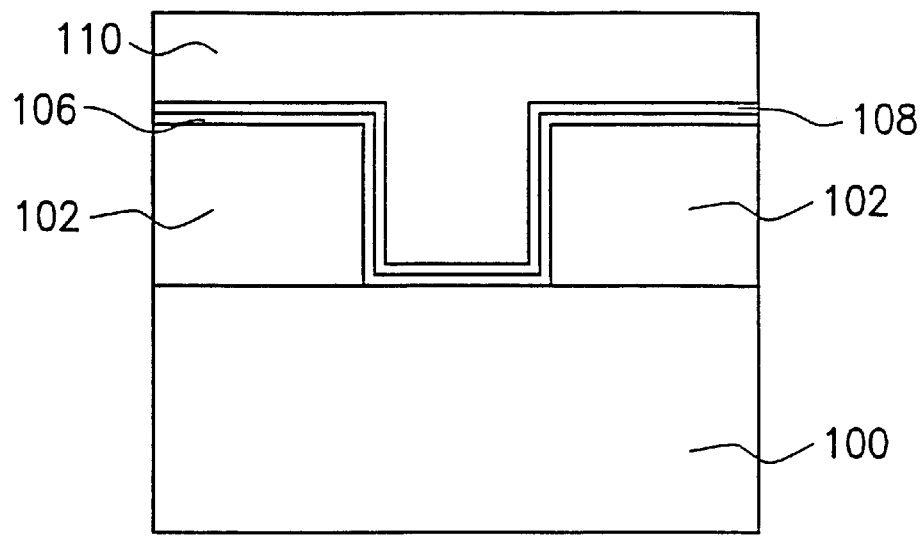
Figure 1E:
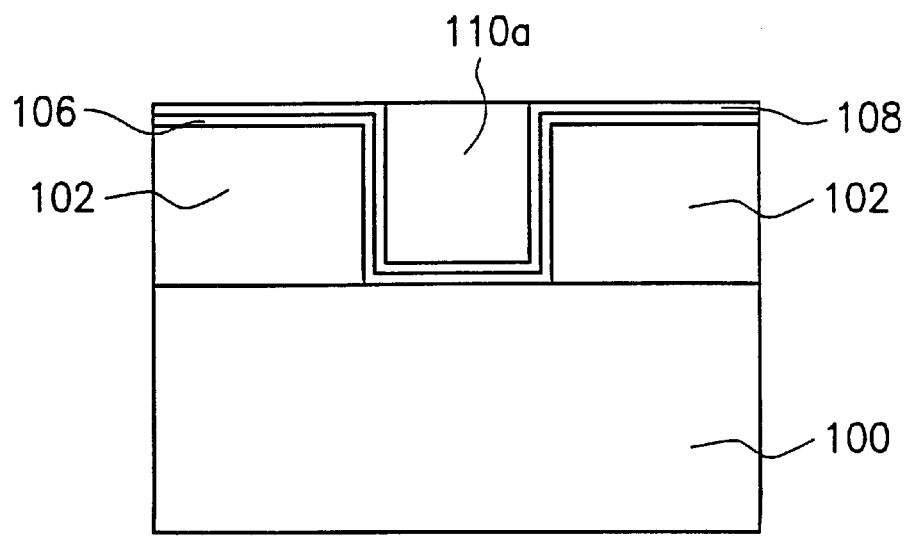
Figure 2A:
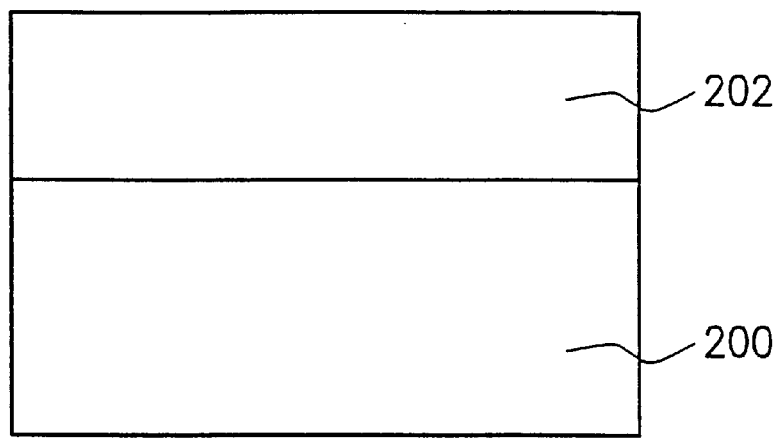
FIG. 2A to FIG. 2F are cross sectional views of the process of forming an interconnection of a semiconductor device in a preferred embodiment according to the invention.

Referring to FIG. 2A, a semiconductor substrate 200 having a MOS device and a metal layer formed thereon is provided. A dielectric layer 202 is formed over the substrate 200 as an inter-metal dielectric. A preferred dielectric layer comprises a single-layered or double layered spin-on-glass sandwich structured dielectric layer. This kind of structure prevents the formation of voids during chemical vapour deposition for forming the dielectric layer. The sandwich structured dielectric layer is formed by plasma enhanced chemical vapour deposition (PECVD), using tetra-ethyl-oxy-silane (TEOS) as precursor. A first dielectric layer is then formed by the deposition of silicon oxide. A spin-on-glass layer is formed on the first dielectric layer. Being baked and cured, a second dielectric layer is formed on the spin-on-glass layer, and the sandwich structured dielectric layer 202 is thus formed.

Figure 2B:
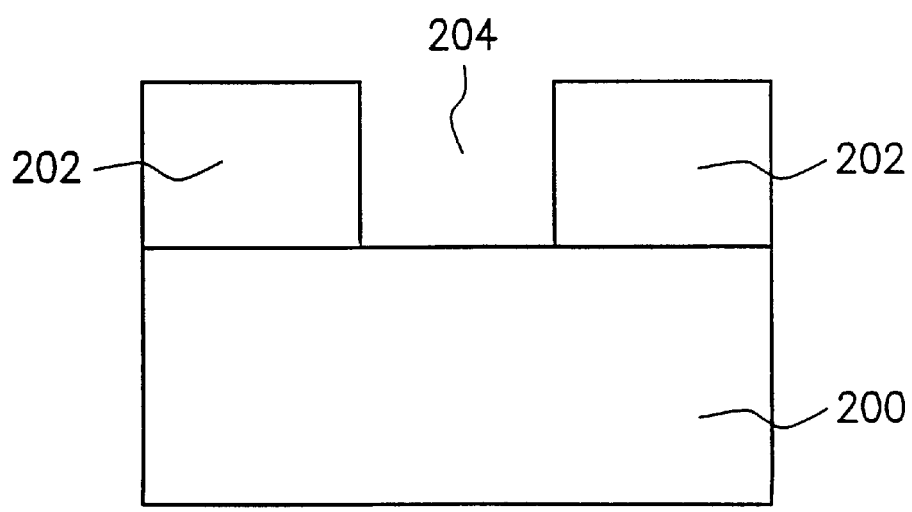

Referring FIG. 2B, using a mask to cover the dielectric layer 202, after photolithography and etching processes, the connecting channel, such as a via hole or a contact window 204, for connecting different metal layers is formed to expose the substrate 200.

Figure 2C:
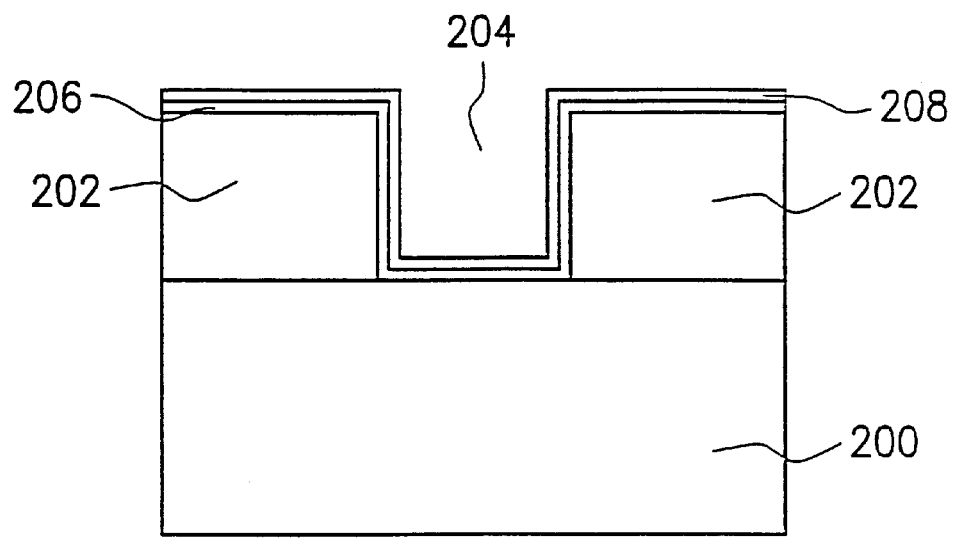

Referring to FIG. 2C, to improve the adhesion between the tungsten plug formed subsequently and other materials, before the deposition of tungsten metal, a layer of titanium nitride or tungsten nitride is formed. In addition to improving the adhesion, by the difference of the plasma spectra between tungsten and titanium nitride or tungsten nitride, the titanium nitride or tungsten nitride is also used as an etching stop layer. Applying titanium nitride to the process metallization, titanium nitride is assembled with titanium as a form of titanium nitride/titanium layer. Before the formation of a metal plug, a metal glue layer 206 is formed on the dielectric layer 202 and the circumference of the contact window 204. The metal layer 206 is titanium, for example. A barrier layer 208 is formed on the metal glue layer 206. A preferred metal glue layer 206 having a thickness of 200 Å to 1500 Å is formed by DC magnetron sputtering in an environment of argon. A preferred barrier layer 208 having a thickness of 800 Å to 1200 Å is formed by physical vapour deposition. The barrier layer 208 can normally be formed in two ways. One is using DC magnetron sputtering to form a titanium layer, and to put the device in an environment of nitrogen or ammonia. Through a rapid thermal process, the titanium layer is nitridized into a titanium nitride layer. The other way is to using reactive sputtering for the deposition of titanium nitride. Using a titanium target, and a mixture of argon and nitrogen as an reactive gas source, the titanium sputtered after ion bombardment is reacted with nitrogen produced by dissociation reaction from the plasma to form a titanium nitride layer. To improve the adhesion between the barrier layer 208 and the glue layer 206, after the formation of titanium nitride barrier layer, at a range of temperature between 550° C. to 900°, a rapid thermal nitridation is performed.

Figure 2D:
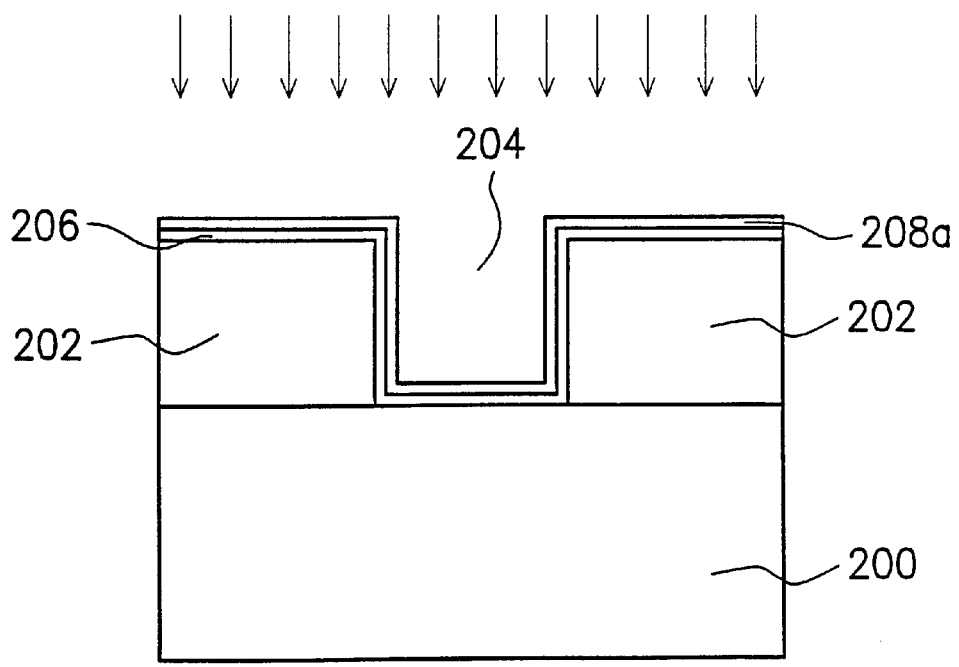

Referring to FIG. 2D, by performing nitrogen plasma bombardment towards the titanium nitrogen barrier layer 208, the number of nucleation seeds of titanium nitride is increased. The size of the seeds is identical. The surface of the titanium nitride layer 208a is finer and more delicate, and therefore, the quality the titanium nitride barrier layer 208a is improved with a better adhesion. Due to the increased number of nucleation seeds, and the identical size of the seeds, the metal residue after etching back is improved.

Figure 2E:
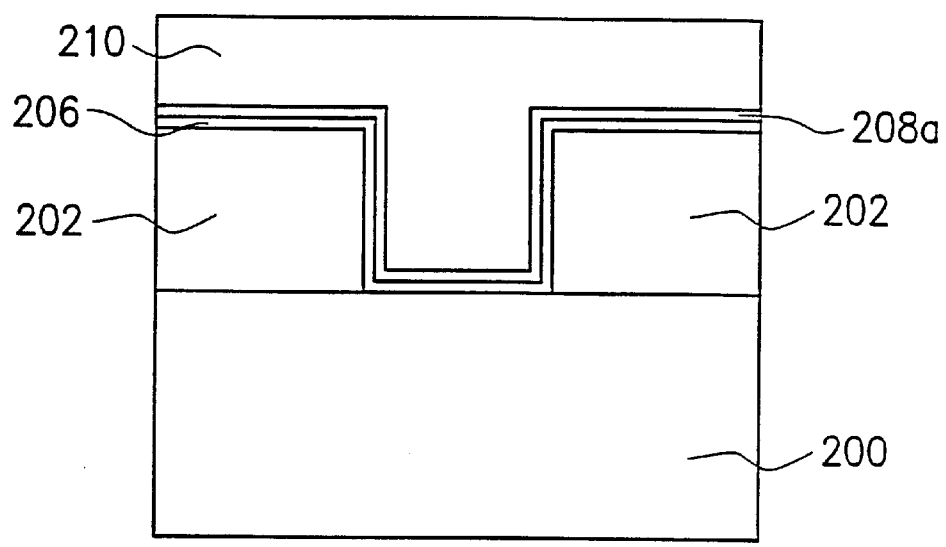

Referring to FIG. 2E, a refractory and good conductive metal layer 210, for example, a tungsten layer, is formed to cover the titanium nitride layer 208a and fill the contact window 204. To obtain a better adhesion between the tungsten formed by chemical vapour deposition and other materials, a preferred process for the deposition of tungsten is using tungsten fluoride as a reactive gas. Under the pressure of 1 torr to 100 torr, and at the temperature of 300° C. to 550° C., two-step deposition is performed. A thin tungsten nucleation layer is formed on the barrier layer 208a. A tungsten layer having a thickness of 5000 Å to 10000 Å is then formed on the thin tungsten layer and fills the contact window. Due to the very fine and delicate surface of the titanium nitride layer 208a, the reaction of tungsten fluoride and the titanium glue layer along the edge of titanium nitride grain of the barrier layer 208 is suppressed. Moreover, due to the increasing number of the nucleation seeds, and the smaller and identical size of the grain, the nucleation seeds of the deposition of tungsten is increased. Therefore, the size of two grains is further more identical.

Figure 2F:
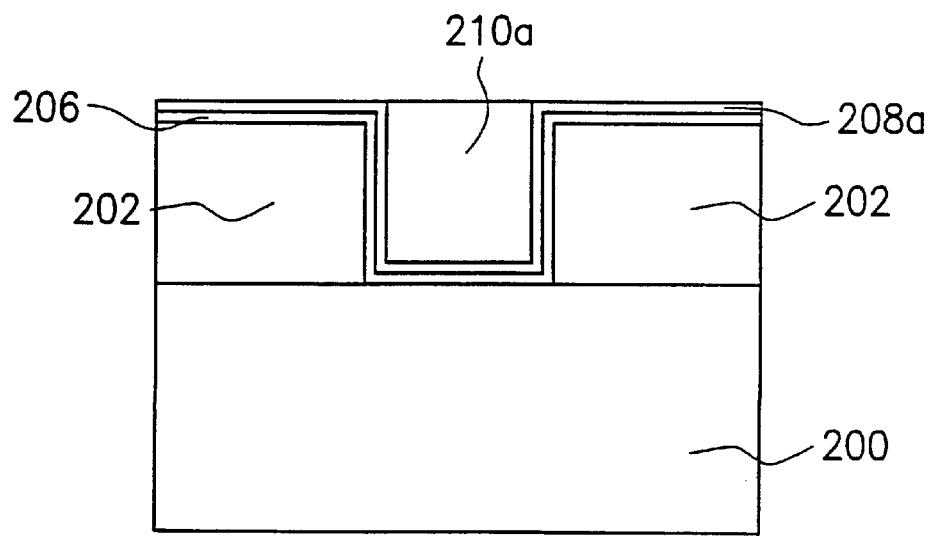

Referring to FIG. 2F, a part of metal layer 210 is removed to form a metal plug 210a within the contact window 204. If the metal layer is a tungsten layer, a gas source containing fluorine, such as a mixture of carbon fluoride and oxygen, a mixture of fluorine nitride and oxygen, or a mixture of fluorine sulfide and oxygen, is used as the etchant with the titanium nitride layer 206 as an etching stop layer. An etching back process is performed to form a tungsten plug 210a.

After the tungsten plug is formed, the subsequent processes, such as the deposition of another metal layer, photolithography and etching process, are performed to form the second level of interconnection.

Therefore, the characteristic of the invention is that after the formation of a titanium glue layer and a titanium nitride layer by a conventional method, using nitrogen plasma bombardment towards the surface of the titanium nitride layer, the electrical characteristics of the titanium nitride layer are improved. On the other hand, due to the increased number of nucleation seed of titanium nitride barrier layer, and the smaller and identical size of the titanium nitride grains, the titanium nitride has a finer and more delicate surface. Therefore, the adhesion and the quality of the titanium nitride layer is enhanced. Moreover, in the subsequent deposition process, the reaction of tungsten fluoride and the titanium glue layer along the edge of titanium nitride grain of the barrier layer is suppressed. Furthermore, the tungsten residue after the etching back process is no longer left.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a metal plug, comprising:

forming a dielectric layer on a substrate having a metal oxide semiconductor device and a first metal layer formed thereon;

forming a contact window to penetrate through the dielectric layer and to expose the first metal layer on the substrate;

forming a metal glue layer on the dielectric layer and a circumference of the contact window;

forming a metal nitride barrier layer on the metal glue layer;

performing a nitrogen plasma bombardment towards the metal nitride barrier layer so that a number of nucleation seeds in the metal nitride barrier layer is increased, and a size of the seeds is substantially identical;

after said performing, forming a second metal layer and filling the contact window; and removing a part of the second metal layer to form a metal plug.

2. The method according to claim 1, wherein the dielectric layer is a single or double layered spin-on-glass sandwich structured dielectric layer.

3. The method according to claim 1, wherein the metal glue layer Is a titanium glue layer.

4. The method according to claim 1, wherein the metal nitride barrier layer is a titanium nitride barrier layer formed by DC magnetron sputtering.

5. The method according to claim 1, wherein the metal nitride barrier layer is a titanium nitride barrier layer formed by reactive sputtering.

6. The method according to claim 1, wherein forming the metal nitride barrier layer further comprises a step of rapid thermal process.

7. The method according to claim 1, wherein the second metal layer is a tungsten layer.

8. The method according to claim 1, wherein the part of the second metal is removed by anisotropic etching.

9. A method of forming a metal plug, comprising:

forming a dielectric layer on a substrate having a metal oxide semiconductor device and a first metal layer formed thereon;

forming a contact window to penetrate through the dielectric layer and to expose the first metal layer on the substrate;

forming a titanium glue layer on the dielectric layer and a circumference of the contact window;

forming a titanium nitride barrier layer on the metal glue layer;

performing a nitrogen plasma bombardment towards the titanium nitride barrier layer so that a number of nucleation seeds in the titanium nitride barrier layer is increased, and a size of the seeds is substantially identical; after said performing, forming a second metal layer and filling the contact window; and removing a part of the second metal layer to form a metal plug.

10. The method according to claim 9, wherein the dielectric layer is a single or double layered spin-on-glass sandwich structured dielectric layer.

11. The method according to claim 9, wherein the titanium nitride barrier layer is formed by DC magnetron sputtering.

12. The method according to claim 9, wherein the titanium nitride barrier layer is formed by reactive sputtering.

13. The method according to claim 9, wherein forming the titanium nitride barrier layer further comprises a step of rapid thermal process.

14. The method according to claim 9, wherein the second metal layer is a tungsten layer.

15. The method according to claim 9, wherein the part of the second metal is removed by anisotropic etching.

16. A method of forming a metal plug, comprising:

forming a dielectric layer on a substrate;

forming a contact window to penetrate through the dielectric layer and to expose the substrate;

forming a titanium glue layer on an upper surface of the dielectric layer and on side walls of the dielectric layer within the contact window;

forming a titanium nitride barrier layer on the metal glue layer;

suppressing a reaction between tungsten fluoride and the titanium glue layer by:

bombarding the titanium nitride barrier layer with nitrogen plasma so as to increase a number of nucleation seeds of the titanium nitride barrier layer, and so as to form an upper surface of the titanium nitride barrier layer to be more finer and more delicate than if the nitrogen plasma bombardment had not been performed, and after said bombarding, forming a second metal layer on the titanium nitride barrier layer and filling the contact window; and removing a portion of the second metal layer to form a metal plug.

17. The method of forming a metal plug as recited in claim 16, wherein said forming a second metal layer includes using tungsten.

18. The method of forming a metal plug as recited in claim 16, wherein said forming a second metal layer includes performing a two-step deposition procedure, including forming a thin tungsten nucleation layer on the titanium nitride barrier layer, and forming a tungsten layer on the thin tungsten nucleation layer so as to fill the contact window.

19. The method of forming a metal plug as recited in claim 18, wherein said forming includes depositing the tungsten layer using chemical vapor deposition using tungsten fluoride as a reactive gas.

20. The method of forming a metal plug as recited in claim 19, wherein said forming is performed at a pressure between about 1 torr and about 100 torrs, and at a temperature between about 300° C. and 550° C., and wherein the tungsten layer has a thickness between about 5,000 Å and about 10,000 Å, and wherein said bombarding reduces a size of the grains of the titanium nitride barrier layer.

* * * * *